United States Patent
Zhang

(10) Patent No.: US 11,950,477 B2
(45) Date of Patent: Apr. 2, 2024

(54) OLED DISPLAY PANEL AND OLED DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Di Zhang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 898 days.

(21) Appl. No.: 16/969,880

(22) PCT Filed: Apr. 28, 2020

(86) PCT No.: PCT/CN2020/087481
§ 371 (c)(1),
(2) Date: Aug. 13, 2020

(87) PCT Pub. No.: WO2021/155643
PCT Pub. Date: Aug. 12, 2021

(65) Prior Publication Data
US 2023/0101058 A1    Mar. 30, 2023

(30) Foreign Application Priority Data

Feb. 7, 2020  (CN) .......................... 202010082961.7

(51) Int. Cl.
*H10K 59/35* (2023.01)

(52) U.S. Cl.
CPC ................................. *H10K 59/353* (2023.02)

(58) Field of Classification Search
None
See application file for complete search history.

(56) References Cited

U.S. PATENT DOCUMENTS

| | | | |
|---|---|---|---|
| 10,916,591 B2* | 2/2021 | He | H10K 59/353 |
| 2018/0053811 A1 | 2/2018 | Wacyk | |
| 2020/0144339 A1* | 5/2020 | He | H10K 59/353 |
| 2021/0384270 A1* | 12/2021 | Liu | H10K 59/122 |
| 2022/0028900 A1* | 1/2022 | Xu | H01L 27/1218 |

FOREIGN PATENT DOCUMENTS

| | | |
|---|---|---|
| CN | 103715227 A | 4/2014 |
| CN | 103872091 A | 6/2014 |
| CN | 104009066 A | 8/2014 |

(Continued)

*Primary Examiner* — Long Pham
(74) *Attorney, Agent, or Firm* — PV IP PC; Wei Te Chung; Zhigang Ma

(57) ABSTRACT

The present application discloses an OLED display panel, including a plurality of first color sub-pixels, a plurality of second color sub-pixels, and a plurality of third color sub-pixels, wherein the first-color subpixels, the second-color subpixels, and the third-color subpixels constitute a plurality of repeating units, the repeating units include a first repeating unit and a second repeating unit, and the first repeating unit and the second repeating unit are arranged at intervals in any row or any column.

18 Claims, 3 Drawing Sheets

(56) References Cited

FOREIGN PATENT DOCUMENTS

| | | |
|---|---|---|
| CN | 104282710 A | 1/2015 |
| CN | 204965933 U | 1/2016 |
| CN | 105762169 A | 7/2016 |
| CN | 105789261 A | 7/2016 |
| CN | 206163494 U | 5/2017 |
| CN | 106887208 A | 6/2017 |
| CN | 107146804 A | 9/2017 |
| CN | 107180854 A | 9/2017 |
| CN | 109713027 A | 5/2019 |
| CN | 110133899 A | 8/2019 |

\* cited by examiner

OLED DISPLAY PANEL AND OLED DISPLAY DEVICE

BACKGROUND OF INVENTION

Field of Invention

The present application relates to the field of display technology, and in particular to an organic light-emitting diode (OLED) display panel and an organic light-emitting diode (OLED) display device.

Description of Prior Art

An organic light-emitting diode (OLED) display panel is the next generation of novel display technology and lighting technology, having huge application prospect. In general, the light-emitting layer of the OLED display panel is formed by vapor-depositing organic materials through a fine metal mask (FMM). The arrangement structure of the RGB three primary colors subpixels has influence on resolution of the OLED display panel, the manufacturing method with the FMM, and yield.

At present, the design of the light-emitting area of the OLED display panel is divided into: RGB strip arrangement design and subpixel rendering design. The RGB strip arrangement design is usually applied to large screen designs such as Pad, and has slightly lower resolution requirement and better display effect. However, the dense pixel arrangement leads to higher requirements for stretching the FMM. For a small size, opening a through hole is a better solution for the commonly used RGB strip arrangement. However, for a larger size, there is a greater risk of stretching deformation of the FMM when it is opened with the through hole, and the process is difficult to control. The existing process performs vapor deposition for the light-emitting layer of each color twice with the FMM to solve this problem, but the cost is higher. Therefore, it is necessary to improve this defect.

SUMMARY OF INVENTION

The present application provides an organic light-emitting diode (OLED) display panel to solve the technical problem of the large-size OLED display panel of the prior art that pixels in the light-emitting area are designed in an RGB strip arrangement, if which uses a evaporation method with a mask opened with a through hole, it will cause stretching deformation of the mask to easily occur, while if which uses a vapor deposition method for each color twice, it will cause higher production cost.

An embodiment of the present application provides an organic light-emitting diode (OLED) display panel, including a plurality of first-color subpixels, a plurality of second-color subpixels, and a plurality of third-color subpixels, wherein the first-color subpixels, the second-color subpixels, and the third-color subpixels constitute a plurality of repeating units, and a light-exiting area of the second-color subpixels is smaller than a light-exiting area of the first-color subpixels and smaller than a light-exiting area of the third-color subpixels, respectively; wherein the repeating units include a first repeating unit and a second repeating unit, the first repeating unit has a pixel arrangement structure provided with one of the second-color subpixels located at lower middle of the first repeating unit, the first-color subpixels are located in a first direction of the second-color subpixels, the third-color subpixels are located in a direction opposite to the first direction of the second-color subpixels; the second repeating unit has a pixel arrangement structure provided with one of the second-color subpixels located at upper middle of the second repeating unit, the third-color subpixels are located in the first direction of the second-color subpixels, and the first-color subpixels are located in a direction opposite to the first direction of the second-color subpixels; wherein the repeating units are arranged in an array, and the first repeating unit and the second repeating unit are arranged at intervals in any row or any column; and wherein adjacent ones of subpixels with a same light emission color share one mask opening, and a distance between a projection of the mask opening on the adjacent ones of subpixels and each of edges of the adjacent ones of subpixels ranges from 0 to 15 microns, in which the edges are adjacent to the projection.

In the OLED display panel provided by an embodiment of the present application, a minimum distance between two subpixels located in a same mask opening ranges from 5 microns to 12 microns.

In the OLED display panel provided by an embodiment of the present application, a minimum distance between adjacent ones of the subpixels with different light emission colors is greater than twice the distance between the projection of the mask opening and the edge.

In the OLED display panel provided by an embodiment of the present application, each of a minimum distance between mask openings corresponding to the first-color subpixels, a minimum distance between mask openings corresponding to the second-color subpixels, and a minimum distance between mask openings corresponding to the third-color subpixels is greater than or equal to 10 microns.

In the OLED display panel provided by an embodiment of the present application, the minimum distance between the mask openings corresponding to the first-color subpixels is equal to the minimum distance between the mask openings corresponding to the third-color subpixels.

In the OLED display panel provided by an embodiment of the present application, each of the first-color subpixels, each of the second-color subpixels, and each of the third-color subpixels are a red subpixel, a green subpixel, and a blue subpixel, respectively.

In the OLED display panel provided by an embodiment of the present application, a light-exiting area of the red subpixel is equal to a light-exiting area of the blue subpixel.

In the OLED display panel provided by an embodiment of the present application, each of the red subpixel, the green subpixel, and the blue subpixel has a shape selected from at least one of a circle, a triangle, a rectangle, a hexagon, and an octagon.

In the OLED display panel provided by an embodiment of the present application, the red subpixel, the green subpixel, and the blue subpixel have a same shape.

Another embodiment of the present application provides an organic light-emitting diode (OLED) display device, including a driving chip and an OLED display panel, wherein the OLED display panel includes a plurality of first-color subpixels, a plurality of second-color subpixels, and a plurality of third-color subpixels, the first-color subpixels, the second-color subpixels, and the third-color subpixels constitute a plurality of repeating units, and a light-exiting area of the second-color subpixels is smaller than a light-exiting area of the first-color subpixels and smaller than a light-exiting area of the third-color subpixels, respectively; wherein the repeating units include a first repeating unit and a second repeating unit, the first repeating unit has a pixel arrangement structure provided with one of the second-color subpixels located at lower middle of the first repeating unit, the first-color subpixels are located in a first direction of the second-color subpixels, the third-color subpixels are located in a direction opposite to the first direction of the second-color subpixels; the second repeating unit has a pixel arrangement structure provided with one of the second-color subpixels located at upper middle of the second repeating unit, the third-color subpixels are located in the first direction of the second-color subpixels, and the first-color subpixels are located in a direction opposite to the first direction of the second-color subpixels; wherein the repeating units are arranged in an array, and the first repeating unit and the second repeating unit are arranged at intervals in any row or any column; and wherein adjacent ones of subpixels with a same light emission color share one mask opening, and a distance between a projection of the mask opening on the adjacent ones of subpixels and a each of edges of the adjacent ones of subpixels ranges from 0 to 15 microns, in which the edges are adjacent to the projection.

In the OLED display device provided by an embodiment of the present application, a minimum distance between two subpixels located in a same mask opening ranges from 5 microns to 12 microns.

In the OLED display device provided by an embodiment of the present application, a minimum distance between adjacent ones of the subpixels with different light emission colors is greater than twice the distance between the projection of the mask opening and the edge.

In the OLED display device provided by an embodiment of the present application, each of a minimum distance between mask openings corresponding to the first-color subpixels, a minimum distance between mask openings corresponding to the second-color subpixels, and a minimum distance between mask openings corresponding to the third-color subpixels is greater than or equal to 10 microns.

In the OLED display device provided by an embodiment of the present application, the minimum distance between the mask openings corresponding to the first-color subpixels is equal to the minimum distance between the mask openings corresponding to the third-color subpixels.

In the OLED display device provided by an embodiment of the present application, each of the first-color subpixels, each of the second-color subpixels, and each of the third-color subpixels are a red subpixel, a green subpixel, and a blue subpixel, respectively.

In the OLED display device provided by an embodiment of the present application, a light-exiting area of the red subpixel is equal to a light-exiting area of the blue subpixel.

In the OLED display device provided by an embodiment of the present application, each of the red subpixel, the green subpixel, and the blue subpixel has a shape selected from at least one of a circle, a triangle, a rectangle, a hexagon, and an octagon.

In the OLED display device provided by an embodiment of the present application, the red subpixel, the green subpixel, and the blue subpixel have a same shape.

In this application, the pixels in the light-emitting area are designed as a plurality of repeating units arranged in an array, and the repeating units are divided into a first repeating unit and a second repeating unit. The first repeating unit and the second repeating unit are arranged at intervals in any row or any column, so that adjacent ones of the subpixels with the same light emission color share a mask opening for evaporation, and the risk of stretching deformation of the mask can be reduced without increasing the production cost.

DETAILED DESCRIPTION OF PREFERRED EMBODIMENTS

In order to make the purpose, technical solutions, and effects of the present application clearer and definite, the present application will be described in further detail below with reference to the accompanying drawings and examples. It should be understood that the specific embodiments described herein are only used to explain the present application, and are not used to limit the present application.

Figure 1:
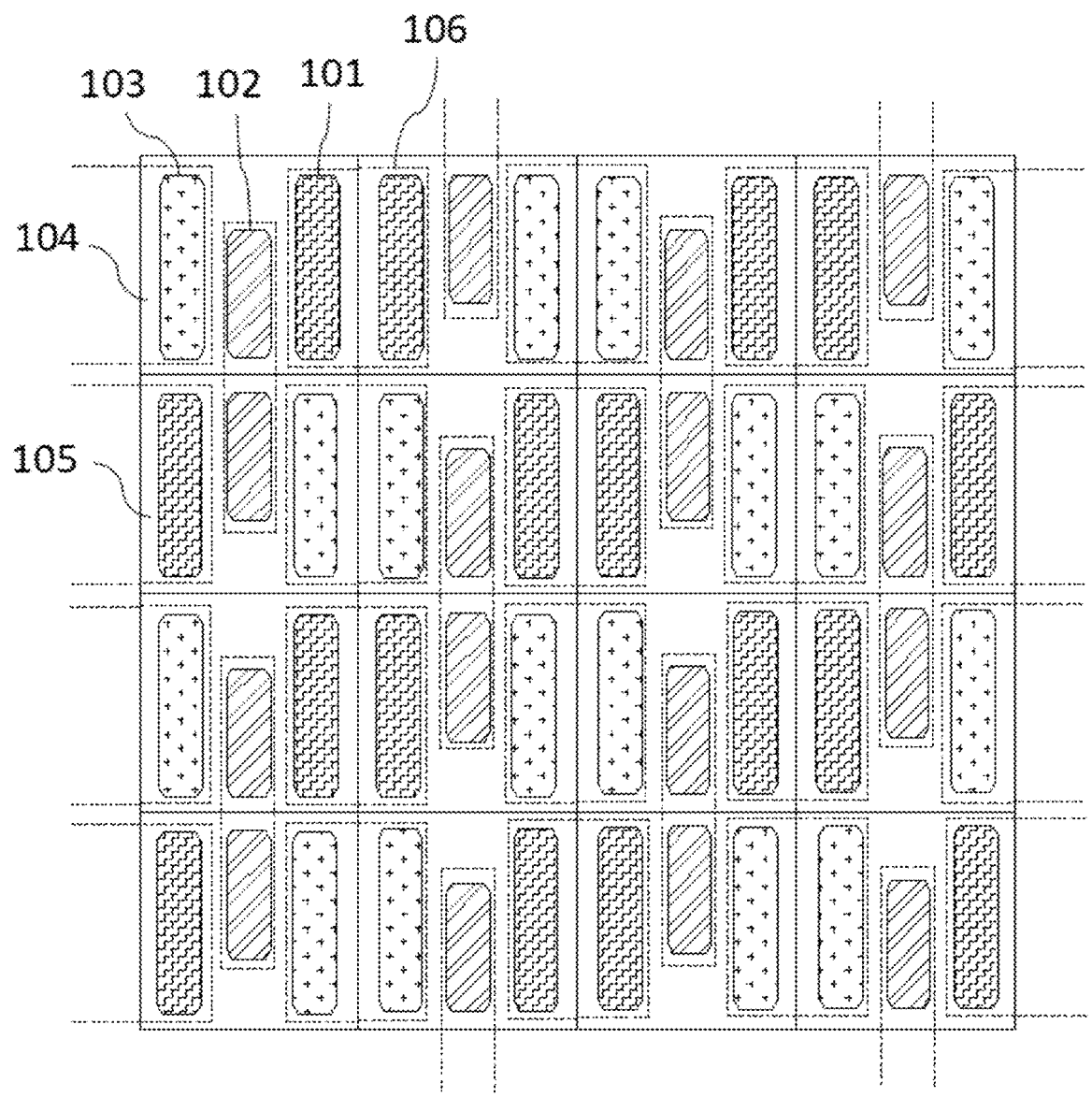
FIG. 1 is a schematic diagram of pixel arrangement of a light-emitting area of an organic light-emitting diode (OLED) display panel provided in Embodiment 1 of the present application.

As shown in FIG. 1, which is a schematic diagram of pixel arrangement of a light-emitting area of an organic light-emitting diode (OLED) display panel provided in Embodiment 1 of the present application, the components of the present application and the relative positional relationship between the components can be seen intuitively. The OLED display panel includes a plurality of first-color subpixels 101, a plurality of second-color subpixels 102, and a plurality of third-color subpixels 103, wherein the first-color subpixels 101, the second-color subpixels 102, and the third-color subpixels 103 constitute a plurality of repeating units, and a light-exiting area of the second-color subpixels 102 is smaller than a light-exiting area of the first-color subpixels 101 and smaller than a light-exiting area of the third-color subpixels 103, respectively. The repeating unit includes a first repeating unit 104 and a second repeating unit 105. The first repeating unit 104 has a pixel arrangement structure provided with one of the second-color subpixels 102 located at lower middle of the first repeating unit 104, the first-color subpixels 104 are located in a first direction of the second-color subpixels 102, the third-color subpixels 103 are located in a direction opposite to the first direction of the second-color subpixels 102; the second repeating unit 105 has a pixel arrangement structure provided with one of the second-color subpixels 102 located at upper middle of the second repeating unit 105, the third-color subpixels 103 are located in the first direction of the second-color subpixels 102, and the first-color subpixels 101 are located in a direction opposite to the first direction of the second-color subpixels 102. The repeating units are arranged in an array, and the first repeating unit 104 and the second repeating unit 105 are arranged at intervals in any row or any column. Adjacent ones of subpixels with a same light emission color share one mask opening 106, and a distance L between a projection of the mask opening 106 on the adjacent two first-color subpixels 101 and each of edges of the adjacent two first-color subpixels 101 ranges from 0 to 15 microns, where the edges are adjacent to the projection.

It should be noted that since brightness of the second-color subpixels 102 is greater than the brightness of the first-color subpixels 101 and the third-color subpixels 103, the light-emitting area of the second-color subpixels 102 Respectively smaller than the light-emitting areas of the first-color subpixels 101 and the third-color subpixels 103.

In an embodiment, the light-emitting area of the third-color subpixels 103 is larger than the light-emitting area of the first-color subpixels 101 and larger than the light-emitting area of the second-color subpixels 102, because the third-color subpixels 103 has a decay speed faster than the first-color subpixels 101 and the second-color subpixels 102.

It should be noted that the first direction refers to the left or the right, that is, pixels on opposite sides of the first repeating unit 104 and pixels on opposite sides of the second repeating unit 105 adjacent to each other are centrosymmetric to each other. symmetry. In FIG. 1, the first direction refers to the right, and the opposite direction of the first direction is the left. In other embodiments, the first direction may also be the left, and the opposite direction of the first direction is the right.

It should be noted, the description that the repeating units are arranged in an array, and the first repeating unit 104 and the second repeating unit 105 are arranged at intervals in any row or any column refers to: the subpixels are still arranged in strips, a plurality of repeating units are arranged in a plurality of columns, and each of the columns can be divided into three sub-columns. In a left sub-column and a right sub-column, the first-color subpixels and the third-color subpixels are arranged at intervals, and in a middle sub-column, the second-color subpixels are arranged. The subpixels in the left sub-column have colors in a cross-correspondence to the subpixels in the right sub-column, and the colors in adjacent ones of the sub-columns in different column are arranges in a same order.

It should be noted, the description that adjacent ones of the subpixels with the same light emission color share a mask opening 106 specifically means that adjacent ones of the subpixels with the same light emission color that are closest to each other share a mask opening for vapor deposition. In an organic light-emitting diode (OLED) display panel provided by an embodiment of the present application, adjacent ones of the subpixels having the same light emission color share a mask opening for vapor deposition, and the risk of stretching deformation of the mask can be reduced without increasing cost.

It should be noted that the first-color subpixels 101, the second-color subpixels 102, and the third-color subpixels 103 are all pixels defined by the pixel definition layer, and the mask opening needs to be designed to be spaced apart from the pixel definition layer by a certain distance, to ensure the deposition accuracy. The range of the spacing is 0 to 15 microns.

In an embodiment, the first-color subpixels 101, the second-color subpixels 102, and the third-color subpixels 103 are a red subpixel, a green subpixel, and a blue subpixel, respectively.

In an embodiment, the light-emitting area of the red subpixel is equal to the light-emitting area of the blue subpixel.

In an embodiment, each of the red subpixel, the green subpixel, and the blue subpixel has a shape selected from at least one of a circle, a triangle, a rectangle, a hexagon, and an octagon.

In an embodiment, the red subpixel, the green subpixel, and the blue subpixel have a same shape.

Figure 2:
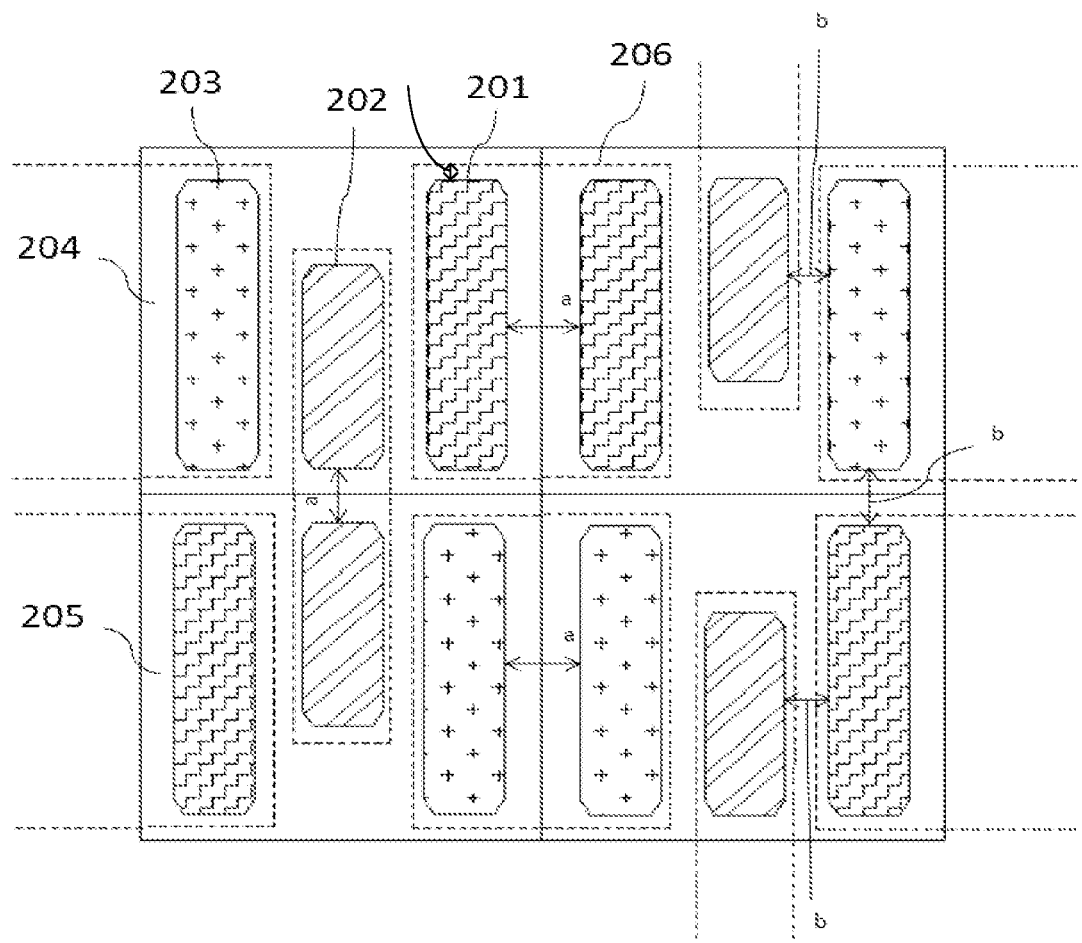
FIG. 2 is a schematic diagram of pixel arrangement of a light-emitting area of an organic light-emitting diode (OLED) display panel provided in Embodiment 2 of the present application.

As shown in FIG. 2, which is a schematic diagram of pixel arrangement of a light-emitting area of an organic light-emitting diode (OLED) display panel provided in Embodiment 2 of the present application, the components of the present application and the relative positional relationship between the components can be seen intuitively. The OLED display panel includes a plurality of first-color subpixels 201, a plurality of second-color subpixels 202, and a plurality of third-color subpixels 203, wherein the first-color subpixels 201, the second-color subpixels 202, and the third-color subpixels 203 constitute a plurality of repeating units, and a light-exiting area of the second-color subpixels 202 is smaller than a light-exiting area of the first-color subpixels 201 and smaller than a light-exiting area of the third-color subpixels 203, respectively. The repeating unit includes a first repeating unit 204 and a second repeating unit 205. The first repeating unit 204 has a pixel arrangement structure provided with one of the second-color subpixels 202 located at lower middle of the first repeating unit 204, the first-color subpixels 204 are located in a first direction of the second-color subpixels 202, the third-color subpixels 203 are located in a direction opposite to the first direction of the second-color subpixels 202; the second repeating unit 205 has a pixel arrangement structure provided with one of the second-color subpixels 202 located at upper middle of the second repeating unit 205, the third-color subpixels 203 are located in the first direction of the second-color subpixels 202, and the first-color subpixels 201 are located in a direction opposite to the first direction of the second-color subpixels 202. The repeating units are arranged in an array, and the first repeating unit 204 and the second repeating unit 205 are arranged at intervals in any row or any column. Adjacent ones of subpixels with a same light emission color share one mask opening 206, and a distance L between a projection of the mask opening 206 on the two adjacent first-color subpixels 201 and each upper edge of the two adjacent first-color subpixels 201 ranges from 0 to 15 microns, where the upper edges are adjacent to the projection, as shown in FIG. 2. It should be noted that the distance L is also marked between this projection and other edges, which are adjacent to the projection, of the two adjacent first-color subpixels 201. Further, the distance L are not marked in FIGS. 1 and 3 for the sake of simplicity.

It should be noted that the first direction refers to the left or the right, that is, pixels on opposite sides of the first repeating unit 204 and pixels on opposite sides of the second repeating unit 205 adjacent to each other are centrosymmetric to each other. symmetry. In FIG. 2, the first direction refers to the right, and the opposite direction of the first direction is the left. In other embodiments, the first direction may also be the left, and the opposite direction of the first direction is the right.

In an embodiment, in order to ensure the deposition accuracy, a minimum distance between two subpixels located in a same mask opening ranges from 5 microns to 12 microns, that is, a minimum distance a between two subpixels having of the same emission color in a same mask opening ranges from 5 microns to 12 microns, which may refer to a spacing between the first-color subpixels 201 located in the same mask opening, between the second-color subpixels 202 located in the same mask opening, or between the third-color subpixels 203 located in the same mask opening. The spacings between the first-color subpixels 201 located in the same mask opening, between the second-color subpixels 202 located in the same mask opening, and between the third-color subpixels 203 located in the same mask opening may be equal, for example, equal to 10 microns, or may be unequal, for example, not equal and selected from 6 microns, 8 microns, and/or 10 microns. Alternatively, two of them are equal to 6 microns, 8 microns, 8 microns.

In an embodiment, in order to ensure the deposition accuracy, a minimum distance b between adjacent ones of the subpixels with different light emission colors is greater than twice the distance L. That is, the minimum distance b between adjacent ones of the subpixels with different light emission colors depends on the distance L, which is any value between 0 and 15 microns, and if the distance L is 10 microns, b is greater than 20 microns.

Figure 3:
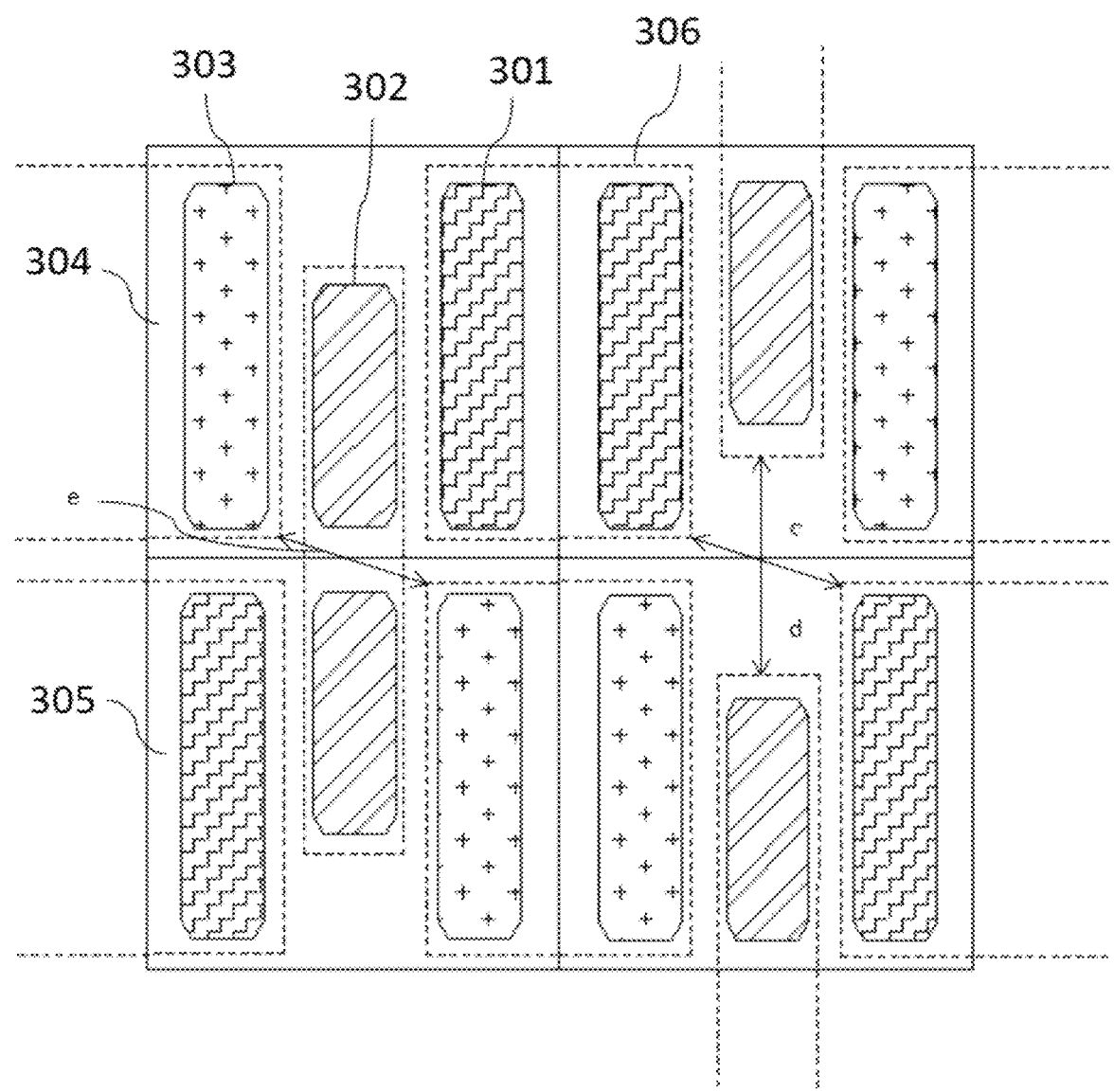
FIG. 3 is a schematic diagram of pixel arrangement of a light-emitting area of an organic light-emitting diode (OLED) display panel provided in Embodiment 3 of the present application.

As shown in FIG. 3, which is a schematic diagram of pixel arrangement of a light-emitting area of an organic light-emitting diode (OLED) display panel provided in Embodiment 1 of the present application, the components of the present application and the relative positional relationship between the components can be seen intuitively. The OLED display panel includes a plurality of first-color subpixels 301, a plurality of second-color subpixels 302, and a plurality of third-color subpixels 303, wherein the first-color subpixels 301, the second-color subpixels 302, and the third-color subpixels 303 constitute a plurality of repeating units, and a light-exiting area of the second-color subpixels 302 is smaller than a light-exiting area of the first-color subpixels 301 and smaller than a light-exiting area of the third-color subpixels 303, respectively. The repeating unit includes a first repeating unit 304 and a second repeating unit 305. The first repeating unit 304 has a pixel arrangement structure provided with one of the second-color subpixels 302 located at lower middle of the first repeating unit 304, the first-color subpixels 304 are located in a first direction of the second-color subpixels 302, the third-color subpixels 303 are located in a direction opposite to the first direction of the second-color subpixels 302; the second repeating unit 305 has a pixel arrangement structure provided with one of the second-color subpixels 302 located at upper middle of the second repeating unit 305, the third-color subpixels 303 are located in the first direction of the second-color subpixels 302, and the first-color subpixels 301 are located in a direction opposite to the first direction of the second-color subpixels 302. The repeating units are arranged in an array, and the first repeating unit 304 and the second repeating unit 305 are arranged at intervals in any row or any column. Adjacent ones of subpixels with a same light emission color share one mask opening 306, and a distance between a projection of the mask opening 306 on adjacent two first-color subpixels 301 and each of edges of the adjacent two first-color subpixels 301 ranges from 0 to 15 microns, where the edges are adjacent to the projection.

It should be noted that the first direction refers to the left or the right, that is, pixels on opposite sides of the first repeating unit 304 and pixels on opposite sides of the second repeating unit 305 adjacent to each other are centrosymmetric to each other. symmetry. In FIG. 3, the first direction refers to the right, and the opposite direction of the first direction is the left. In other embodiments, the first direction may also be the left, and the opposite direction of the first direction is the right.

In an embodiment, in order to ensure the accuracy of mask stretching and balance the stress of the mask stretching, each of a minimum distance between mask openings corresponding to the first-color subpixels 301, a minimum distance between mask openings corresponding to the second-color subpixels 302, and a minimum distance between mask openings corresponding to the third-color subpixels 303 is greater than or equal to 10 microns. Specifically, the minimum distance c between mask openings corresponding to the first-color subpixels 301 is greater than or equal to 10 microns, the minimum distance d between mask openings corresponding to the second-color subpixels 302 is greater than or equal to 10 microns, and the minimum distance e between mask openings corresponding to the third-color subpixels 303 is greater than or equal to 10 microns.

It should be noted that the subpixels of three emission colors are produced using three masks, and because the opening positions on the mask for the subpixels with the same emission color have been staggered, which solves the technical problem of the large-size OLED display panel of the prior art that pixels designed in a strip arrangement causes stretching deformation of the mask to easily occur, and vapor deposition method for each color used twice causes higher production cost.

In an embodiment, the minimum distances between mask openings corresponding to the first-color subpixels 301 and between mask openings corresponding to the third-color subpixels 303 are equal, that is, c is equal to e.

An embodiment of the present application further provides an organic light-emitting diode (OLED) display device, including a driving chip and the above-mentioned OLED display panel. The OLED display device provided in the embodiments of the present application may be any product or component having a display function, such as a mobile phone, a tablet computer, a television, a display, a notebook computer, a digital camera, a navigator, and the like.

In summary, in an organic light-emitting diode (OLED) display panel provided by an embodiment of the present application, the pixels in the light-emitting area are designed as a plurality of repeating units arranged in an array, the repeating units are divided into a first repeating unit and a second repeating unit, the first repeating unit and the second repeating unit are arranged at intervals in any row or any column, so that adjacent ones of the subpixels with the same light emission color share a mask opening for evaporation, and the risk of stretching deformation of the mask can be reduced without increasing the production cost, which solves the technical problem of the large-size OLED display panel of the prior art that pixels in the light-emitting area are designed in an RGB strip arrangement, if which uses a evaporation method with a mask opened with a through hole, it will cause stretching deformation of the mask to easily occur, while if which uses a vapor deposition method for each color twice, it will cause higher production cost.

It can be understood that, for those of ordinary skill in the art, equivalent replacements or changes can be made according to the technical solutions and inventive concepts of the present application, and all such changes or replacements should fall within the protection scope of the claims appended to the present application.

What is claimed is:

1. An organic light-emitting diode (OLED) display panel, comprising a plurality of first-color subpixels, a plurality of second-color subpixels, and a plurality of third-color subpixels, wherein the first-color subpixels, the second-color subpixels, and the third-color subpixels constitute a plurality of repeating units, and a light-exiting area of the second-color subpixels is smaller than a light-exiting area of the first-color subpixels and smaller than a light-exiting area of the third-color subpixels, respectively;

wherein the repeating units comprise a first repeating unit and a second repeating unit, the first repeating unit has a pixel arrangement structure provided with one of the second-color subpixels located at lower middle of the first repeating unit, the first-color subpixels are located in a first direction of the second-color subpixels, the third-color subpixels are located in a direction opposite to the first direction of the second-color subpixels; the second repeating unit has a pixel arrangement structure provided with one of the second-color subpixels located at upper middle of the second repeating unit, the third-color subpixels are located in the first direction of the second-color subpixels, and the first-color subpixels are located in a direction opposite to the first direction of the second-color subpixels;

wherein the repeating units are arranged in an array, and the first repeating unit and the second repeating unit are arranged at intervals in any row or any column; and wherein adjacent ones of subpixels with a same light emission color share one mask opening, and a distance between a projection of the mask opening on the adjacent ones of subpixels and each of edges of the adjacent ones of subpixels ranges from 0 to 15 microns, wherein the edges are adjacent to the projection.

2. The OLED display panel according to claim 1, wherein a minimum distance between two subpixels located in a same mask opening ranges from 5 microns to 12 microns.

3. The OLED display panel according to claim 1, wherein a minimum distance between adjacent ones of the subpixels with different light emission colors is greater than twice the distance between the projection of the mask opening and the edge.

4. The OLED display panel according to claim 1, wherein each of a minimum distance between mask openings corresponding to the first-color subpixels, a minimum distance between mask openings corresponding to the second-color subpixels, and a minimum distance between mask openings corresponding to the third-color subpixels is greater than or equal to 10 microns.

5. The OLED display panel according to claim 4, wherein the minimum distance between the mask openings corresponding to the first-color subpixels is equal to the minimum distance between the mask openings corresponding to the third-color subpixels.

6. The OLED display panel according to claim 1, wherein each of the first-color subpixels, each of the second-color subpixels, and each of the third-color subpixels are a red subpixel, a green subpixel, and a blue subpixel, respectively.

7. The OLED display panel according to claim 6, wherein a light-exiting area of the red subpixel is equal to a light-exiting area of the blue subpixel.

8. The OLED display panel according to claim 6, wherein each of the red subpixel, the green subpixel, and the blue subpixel has a shape selected from at least one of a circle, a triangle, a rectangle, a hexagon, and an octagon.

9. The OLED display panel according to claim 8, wherein the red subpixel, the green subpixel, and the blue subpixel have a same shape.

10. An organic light-emitting diode (OLED) display device, comprising a driving chip and an OLED display panel, wherein the OLED display panel comprises a plurality of first-color subpixels, a plurality of second-color subpixels, and a plurality of third-color subpixels, the first-color subpixels, the second-color subpixels, and the third-color subpixels constitute a plurality of repeating units, and a light-exiting area of the second-color subpixels is smaller than a light-exiting area of the first-color subpixels and smaller than a light-exiting area of the third-color subpixels, respectively;

wherein the repeating units comprise a first repeating unit and a second repeating unit, the first repeating unit has a pixel arrangement structure provided with one of the second-color subpixels located at lower middle of the first repeating unit, the first-color subpixels are located in a first direction of the second-color subpixels, the third-color subpixels are located in a direction opposite to the first direction of the second-color subpixels; the second repeating unit has a pixel arrangement structure provided with one of the second-color subpixels located at upper middle of the second repeating unit, the third-color subpixels are located in the first direction of the second-color subpixels, and the first-color subpixels are located in a direction opposite to the first direction of the second-color subpixels;

wherein the repeating units are arranged in an array, and the first repeating unit and the second repeating unit are arranged at intervals in any row or any column; and wherein adjacent ones of subpixels with a same light emission color share one mask opening, and a distance between a projection of the mask opening on the adjacent ones of subpixels and each of edges of the adjacent ones of subpixels ranges from 0 to 15 microns, wherein the edges are adjacent to the projection.

11. The OLED display device according to claim 10, wherein a minimum distance between two subpixels located in a same mask opening ranges from 5 microns to 12 microns.

12. The OLED display device according to claim 10, wherein a minimum distance between adjacent ones of the subpixels with different light emission colors is greater than twice the distance between the projection of the mask opening and the edge.

13. The OLED display device according to claim 10, wherein each of a minimum distance between mask openings corresponding to the first-color subpixels, a minimum distance between mask openings corresponding to the second-color subpixels, and a minimum distance between mask openings corresponding to the third-color subpixels is greater than or equal to 10 microns.

14. The OLED display device according to claim 13, wherein the minimum distance between the mask openings corresponding to the first-color subpixels is equal to the minimum distance between the mask openings corresponding to the third-color subpixels.

15. The OLED display device according to claim 10, wherein each of the first-color subpixels, each of the second-color subpixels, and each of the third-color subpixels are a red subpixel, a green subpixel, and a blue subpixel, respectively.

16. The OLED display device according to claim 15, wherein a light-exiting area of the red subpixel is equal to a light-exiting area of the blue subpixel.

17. The OLED display device according to claim 15, wherein each of the red subpixel, the green subpixel, and the blue subpixel has a shape selected from at least one of a circle, a triangle, a rectangle, a hexagon, and an octagon.

18. The OLED display device according to claim 17, wherein the red subpixel, the green subpixel, and the blue subpixel have a same shape.

* * * * *